United States Patent
Taylor

(10) Patent No.: US 11,011,605 B2
(45) Date of Patent: May 18, 2021

(54) DIAMOND SEMICONDUCTOR DEVICE

(71) Applicant: Evince Technology Ltd., Tyne and Wear (GB)

(72) Inventor: Gareth Andrew Taylor, Tyne and Wear (GB)

(73) Assignee: Evince Technology Ltd., Tyne and Wear (GB)

( * ) Notice: Subject to any disclaimer, the term of this patent is extended or adjusted under 35 U.S.C. 154(b) by 0 days.

(21) Appl. No.: 16/495,784

(22) PCT Filed: Feb. 28, 2018

(86) PCT No.: PCT/EP2018/054929
§ 371 (c)(1),
(2) Date: Sep. 19, 2019

(87) PCT Pub. No.: WO2018/172029
PCT Pub. Date: Sep. 27, 2018

(65) Prior Publication Data
US 2020/0027683 A1     Jan. 23, 2020

(30) Foreign Application Priority Data

Mar. 22, 2017 (EP) .................................... 17162272

(51) Int. Cl.
*H01L 29/16* (2006.01)
*H01J 1/304* (2006.01)
(Continued)

(52) U.S. Cl.
CPC .......... *H01L 29/1602* (2013.01); *H01J 1/308* (2013.01); *H01J 1/3044* (2013.01);
(Continued)

(58) Field of Classification Search
None
See application file for complete search history.

(56) References Cited

U.S. PATENT DOCUMENTS

| | | | |
|---|---|---|---|
| 5,713,775 A * | 2/1998 | Geis ...................... | H01J 1/3042 445/35 |
| 6,554,673 B2 * | 4/2003 | Pehrsson ................ | B82Y 10/00 313/309 |

(Continued)

FOREIGN PATENT DOCUMENTS

| | | |
|---|---|---|
| EP | 2 605 282 A2 | 6/2013 |
| JP | 2000106435 A | 4/2000 |

OTHER PUBLICATIONS

Vadali V. S. S. Srikanth, P. Sampath Kumar, Vijay Bhooshan Kumar, "A Brief Review on the In Situ Synthesis of Boron-Doped Diamond Thin Films", International Journal of Electrochemistry, vol. 2012, Article ID 218393, 7 pages, 2012. https://doi.org/10.1155/2012/218393. (Year: 2012).*

(Continued)

*Primary Examiner* — J. E. Schoenholtz
(74) *Attorney, Agent, or Firm* — Quarles & Brady LLP

(57) ABSTRACT

An electrical device comprising a substrate of diamond material and elongate metal protrusions extending into respective recesses in the substrate. Doped semiconductor layers, arranged between respective protrusions and the substrate, behave as n type semiconducting material on application of an electric field, between the protrusions and the substrate, suitable to cause a regions of positive space charge within the semiconductor layers.

24 Claims, 5 Drawing Sheets

(51) Int. Cl.
  *H01J 1/308* (2006.01)
  *H01J 9/02* (2006.01)
  *H01L 21/04* (2006.01)
  *H01L 29/06* (2006.01)
  *H01L 29/66* (2006.01)
  *H01L 29/861* (2006.01)

(52) U.S. Cl.
  CPC .......... *H01J 9/025* (2013.01); *H01L 21/042* (2013.01); *H01L 29/0607* (2013.01); *H01L 29/6609* (2013.01); *H01L 29/861* (2013.01); *H01J 2201/3048* (2013.01); *H01J 2201/30411* (2013.01); *H01J 2201/30457* (2013.01)

(56) References Cited

U.S. PATENT DOCUMENTS

| | | | | |
|---|---|---|---|---|
| 9,142,618 | B2* | 9/2015 | Suzuki | H01L 21/02502 |
| 2003/0025431 | A1* | 2/2003 | Pehrsson | H01J 9/025 |
| | | | | 313/311 |
| 2004/0041225 | A1* | 3/2004 | Nemoto | H01L 29/861 |
| | | | | 257/458 |
| 2005/0202665 | A1* | 9/2005 | Namba | H01L 21/02609 |
| | | | | 438/607 |
| 2009/0184328 | A1* | 7/2009 | Taylor | H01L 21/0425 |
| | | | | 257/77 |
| 2014/0145210 | A1* | 5/2014 | Suzuki | H01L 21/02527 |
| | | | | 257/77 |
| 2018/0301535 | A1* | 10/2018 | Bauswell | H01L 21/8206 |

OTHER PUBLICATIONS

M. W. Geis, J. C. Twichell, and T. M. Lyszczarz, "Diamond emitters fabrication and theory", Journal of Vacuum Science & Technology B: Microelectronics and Nanometer Structures Processing, Measurement, and Phenomena 14, 2060 (1996). (Year: 1996).*

PCT International Searching Authority, International Search Report and Written Opinion for Int'l Appl. No. PCT/EP2018/054929, dated May 24, 2018, 16 pages.

K.J. Rietwyk, et al., "Work function and electron affinity of the fluorine-terminated (100) diamond surface", Applied Physics Letters 102, 091604 (2013), A I P Publishing LLC, US, vol. 102, No. 9, Mar. 4, 2013, 4 pages.

* cited by examiner $$f = \frac{V_o}{V} \cdot \frac{I}{I_o}$$

DIAMOND SEMICONDUCTOR DEVICE

This application represents the U.S. national stage entry of International Application No. PCT/EP2018/054929 filed Feb. 28, 2018, which claims priority to European Patent Application No. 17162272.3 filed Mar. 22, 2017, the disclosure of which is incorporated herein by reference in its entirety and for all purposes.

The present invention relates to an electrical device, and relates particularly to an electrical device adapted to generate free electrons by means of solid-state field emission.

Silicon has limitations when used as a base electronic material for switching and amplification applications in high power, high frequency and extreme environments. It is known that diamond is a more suitable material than silicon in such environments because of its thermal, dielectric and carrier mobility properties, and devices made from diamond offer the possibility of significantly reducing complexity by reducing the number of discrete devices needed to carry out an application.

However, it is difficult to fabricate semiconductor devices using diamond. In most semiconductor devices, electronic function is achieved by modifying the electronic properties of the base material through selective introduction of materials known as dopants into the crystalline structure. In the case of diamond, a limited choice of dopants is available because of the relatively small size of the diamond crystal lattice. As a result, the two dopants that create the least disturbance to the diamond crystal structure are boron (p type) and nitrogen (n type). However, although boron doped diamond is a reasonably effective p type semiconductor, no effective n type dopant has yet been found, since both dopant species are deep donors with activation energies of 0.7 eV and 4.5 eV respectively, leading to the requirement for heating to assist the release of charge carriers in order to realise effective device operation. However, the process of heating also causes a reduction in carrier mobility and electric field breakdown strength, thereby compromising two of the main features that make diamond suitable for the fabrication of high power switches.

It is also known to produce alternative electronic devices based upon electron field emission from a sharp tip or protrusion into a vacuum. When an applied electric field is relatively strong, electrons may escape from the material by quantum mechanical tunnelling through a lowered potential energy barrier. Spindt tips are an example of such vacuum field emission device. However, such devices suffer from a number of fundamental problems. Firstly, no vacuum is perfect, and a small number of electrons will therefore collide with residual gas atoms, causing the gas atoms to ionise. These ions then drift towards the regions of highest field strength, and are accelerated in this process such that they impact upon the cathode at the points of emission and effect finite and cumulative damage, as a result of which the lifetime of cold cathode devices is significantly shorter than lifetimes of semiconductor devices. These devices suffer from the further disadvantage that their temperature is significantly increased during operation, as a result of which the electrical resistance of the device increases, thereby decreasing the current that is emitted and introducing secondary degradation mechanisms that further reduce lifetime.

To extend the lifetime of field emission tips the use of a hard coating such as an oxide layer has been explored. An alternative hard coating that could be used is diamond. However such coatings suffer from poor thermal coefficient of expansion matching with the base conductive metal. Another way to alleviate the problem is by embedding a field intensifying structure completely within a dielectric material that nonetheless can sustain high electron mobilities for free electrons. One example of this would be to replace the vacuum by a diamond layer in which the electron emitter is embedded, as disclosed in M. W. Geis et al. "Diamond emitters fabrication and theory", J. Vac. Sci. Technol., B 14(3), May/June 1996. The arrangement described by Geis et al uses substitutional nitrogen as an n type dopant in the diamond layer, which enhances the electric field in the vicinity of the tip of the electron emitter. However, this arrangement suffers from the drawback that the n type dopant in the diamond substrate further away from the metal-diamond interface at the tip of the electron emitter inhibits conduction of electrons through the diamond substrate.

A further known device is disclosed in EP 2605282, which uses a unipolar structure which enables the material properties of diamond to be exploited, and in effect replaces the vacuum described above with diamond. However, this arrangement suffers from the drawback that its performance is limited by the low n type dopant densities that can be achieved with nitrogen in diamond and the associated high activation energy.

US 2014/0145210 A1 discloses a semiconductor device comprising a plurality of semiconductor diamond layers and a trench structure.

EP 2605282 A2 discloses an electrical switching device comprising a diamond substrate and electrically conductive emitters extending into the substrate.

Preferred embodiments of the present invention seek to overcome one or more of the above disadvantages of the prior art.

According to an aspect of the present invention, there is provided an electrical device comprising:

a substrate of diamond material;

at least one elongate first electrically conductive portion extending into a respective recess in said substrate; and at least one doped semiconducting region, arranged between at least one respective said first electrically conductive portion and said substrate, and adapted to behave as an n type semiconducting material on application of an electric field, between said first electrically conductive portion and said substrate, suitable to cause a region of positive space charge within the semiconducting region.

By providing at least one doped semiconducting region, arranged between at least one respective first electrically conductive portion and the substrate, and adapted to behave as an n type semiconductor material on application of an electric field, between the conductive portion and the substrate, suitable to cause a region of positive space charge within the semiconducting region, this provides the advantage of enhancing the local electric field at the interface with the conductive portion, by creating a highly defined region of positive space charge around the conductive portion that greatly improves the efficiency by which electrons are transferred from the conductive medium into the diamond substrate, thereby enabling larger current conduction. The invention has the further advantage that by making the semiconducting region sufficiently thin, the lattice stress caused by introduction of the dopant is relatively insignificant, and a wider choice of dopant materials is available. In addition, by providing a separate semiconducting region between the diamond substrate and the electrically conductive portion, the advantage is provided that the diamond substrate can remain undoped, as a result of which the inhibiting effect of doped diamond on electron conduction can be minimised.

At least one said semiconducting region may include diamond.

At least one said semiconducting region may include at least one donor dopant to impart an n-type semiconducting characteristic to said region.

At least one said semiconducting region may include a plurality of dopant materials so as to impart an n-type semiconducting characteristic to said region.

This provides the advantage of providing a wider selection of energy levels.

At least one said dopant may be a group I element.
At least one said dopant may be a group V element.
At least one said dopant may be a group VI element.

At least one said first electrically conductive portion may be adapted to locally enhance said electric field.

At least one said first electrically conductive portion may include at least one metal that forms a Schottky junction with the semiconducting region.

The device may further comprise at least one second electrically conductive portion connected to at least one said first electrically conductive portion.

This provides the advantage of enabling suitable conductive tracking of the material to be selected.

The device may further comprise at least one first terminating material terminating at least part of a surface of at least one said semiconducting region to impart positive electron affinity thereto.

At least one said first terminating material may comprise oxygen.

At least one said first terminating material may comprise fluorine.

According to another aspect of the invention, there is provide a method of forming an electrical device, the method comprising:

forming at least one recess in a substrate of diamond material;

forming at least one doped semiconducting region in at least one said recess; and forming at least one elongate first electrically conductive portion in at least one said recess, wherein at least one said semiconducting region is arranged between at least one said first electrically conductive portion and said substrate and is adapted to behave as an n type semiconducting material on application of an electric field, between said first electrically conductive portion and said substrate, suitable to cause a region of positive space charge within the semiconducting region.

At least one said semiconducting region may include diamond.

At least one said semiconducting region may include at least one donor dopant to impart an n-type semiconducting characteristic to said region.

At least one said semiconducting region may include a plurality of dopant materials to impart an n-type semiconducting characteristic to said region.

At least one said dopant may be a group I element.
At least one said dopant may be a group V element.
At least one said dopant may be a group VI element.

At least one said first electrically conductive portion may be adapted to locally enhance said electric field.

The method may further comprise applying at least one second electrically conductive portion to at least one said first electrically conductive portion.

The method may further comprise terminating at least part of a surface of at least one said semiconducting region to impart positive electron affinity thereto.

The step of forming at least one recess in a substrate of diamond material may comprise arranging at least one catalytic material on a surface of said substrate, causing said catalytic material to convert diamond in contact therewith into non-diamond carbon material, and causing said catalytic material to penetrate said substrate.

A preferred embodiment of the invention will now be described, by way of example only and not in any limitative sense, with reference to the accompanying drawings in which.

Figure 1:
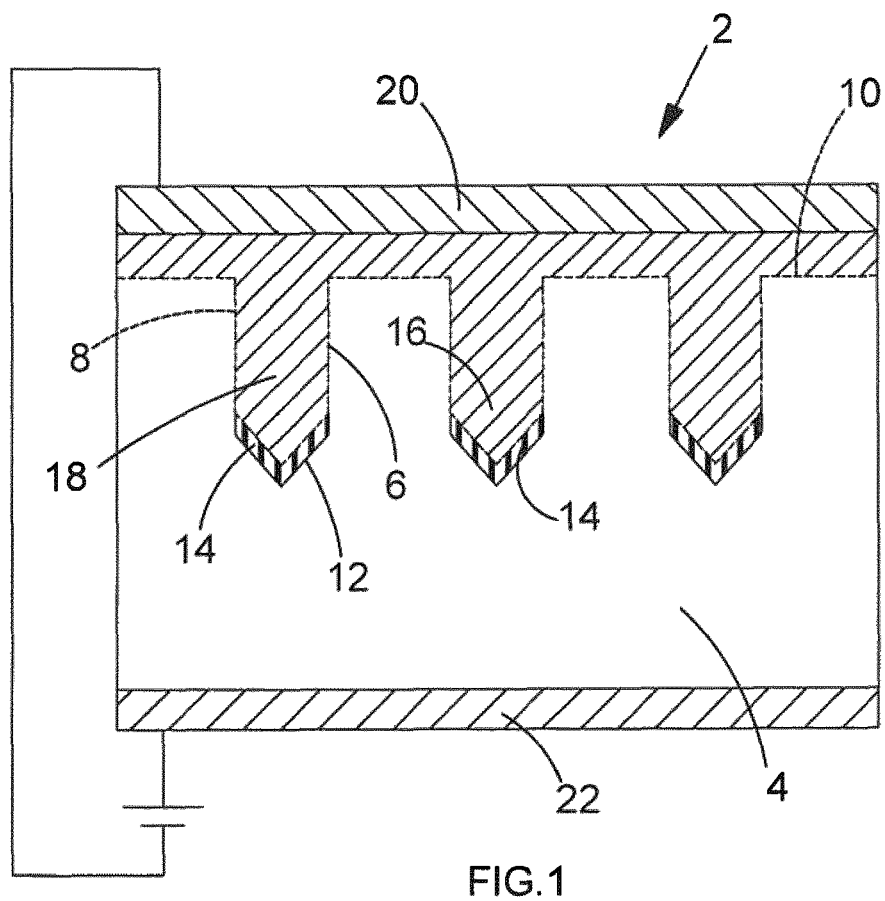
FIG. 1 is a schematic cross sectional view of an electrical device embodying the present invention.

Referring to FIG. 1, a diode type electrical switching device 2 has a diamond substrate 4, in a surface of which recesses 6 are formed by means of an etching process that yields a point with low radius of curvature, for example as defined in EP 2605282. The recesses 6 are preferably elongate in shape, and preferably have side walls 8 generally perpendicular to an upper surface 10 of the substrate 4 and to further decrease the radius of curvature feature inclined distal surfaces 12. This shape of recesses 6 contributes significantly to electric field enhancement in the completed device 2, as will be described in further detail below.

An n type semiconducting region in the form of a semiconductor layer 14 of diamond material, doped with a suitable additive such as a group V element such as nitrogen or phosphorous, or with sulphur, is formed on the diamond substrate 4 and specifically on the distal surfaces 12 of recesses 6. The semiconductor layer 14 can be made sufficiently thin that the addition of the dopant to the semiconductor layer 14 does not cause significant lattice stress in the diamond semiconductor layer 14. A surface 16 of the semiconductor layer 14 facing away from the substrate 4 is modified to impart positive electron affinity to the semiconductor layer 14. This can be achieved by oxygen termination of the surface 16 of the diamond semiconductor layer 14, for example by means of treating the surface 16 in a very heavily oxidising solution, such as a mixture of concentrated sulphuric acid and hydrogen peroxide at more than 100° C. for at least 30 minutes, treatment in a plasma chamber containing an inert gas and oxygen, or heating the diamond layer 14 in a low pressure oxygen atmosphere to 400° C. for 30 minutes, or any combination of the above steps. Alternatively, the surface can be terminated using fluorine.

The recesses 6 are filled with a first electrically conductive material in the form of elongate metal protrusions 18. The protrusions 18 are formed from a metal which exhibits the Schottky effect when in contact with diamond, for example gold, platinum, ruthenium or silver, but generally includes any metal that does not naturally form a carbide with diamond when annealed. The surface termination 16 of the diamond semiconductor layer 14 causes the barrier height between the conductive metal protrusions 18 and the semiconductor diamond layer 14 to be reduced, thereby improving the efficiency with which electrons can tunnel into the conduction band of the bulk diamond substrate 4. A second electrically conductive material in the form of a further metal layer 20 is applied to the conductive metal protrusions 18 to provide additional electrical current carrying capacity and to facilitate easier bonding of the contacts in a device package. An electrode 22 of suitable metal is applied to the opposite surface of the substrate 4 to the metal protrusions 18.

Figure 2:
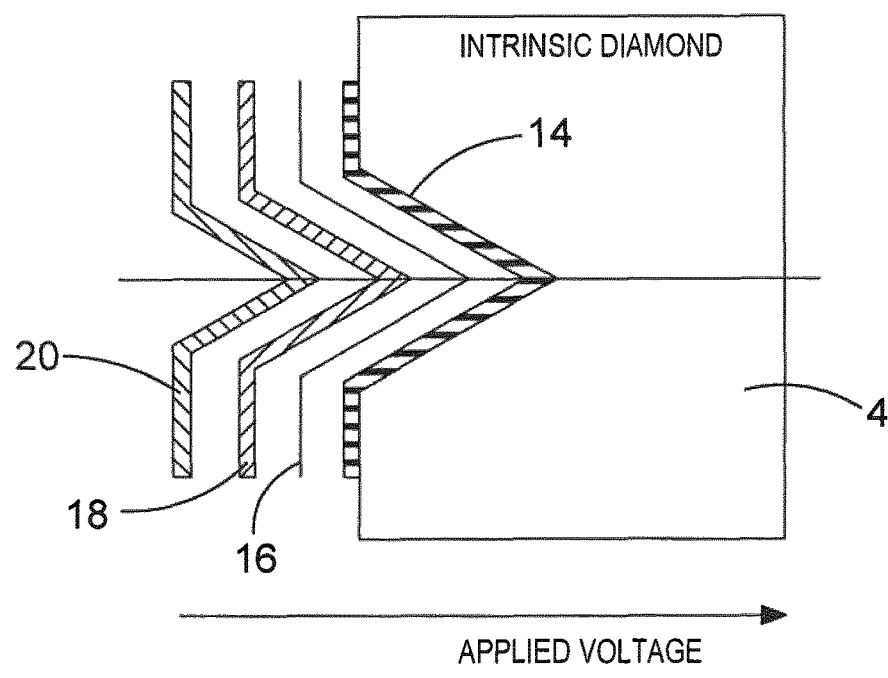
FIG. 2 is an enlarged view of an embedded field emitter layer structure of the device of FIG. 1.

The operation of the device 2 shown in FIGS. 1 and 2 will now be described.

Figure 3:
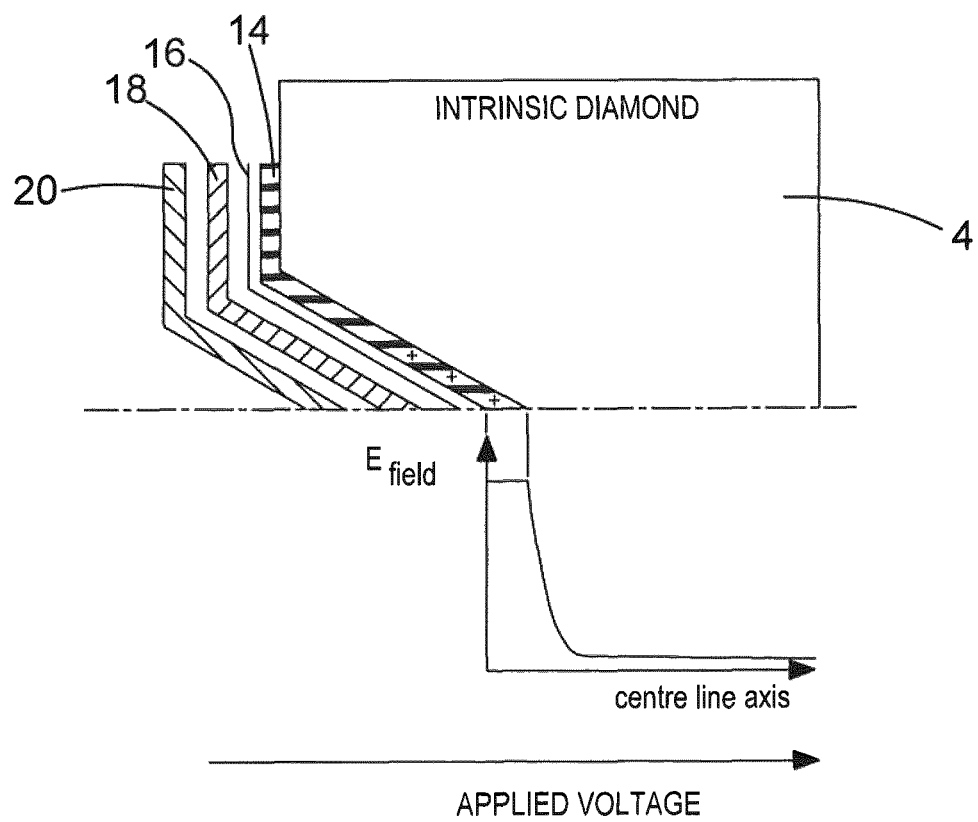
FIG. 3 illustrates the operation of the layer structure of FIG. 2.

When a voltage is applied between the cathode, formed by the conductive protrusions 18 and metal layer 20, and the anode formed by the metal layer 22 on the opposite surface face of the diamond substrate 4, the electric field in the metal protrusions 18 is strongest at the distal ends of the protrusions 18. The n type diamond semiconductor layer 14 loses spare electrons from the dopant material in the layer 14, thereby becoming depleted and creating a region of positive space charge around the distal ends of the metal protrusions 18, as illustrated in FIG. 3. This significantly enhances the local electric field, such that conditions for Fowler-Nordheim quantum mechanical tunnelling can be met. By using n type diamond, the semiconductor layer 14 is fully thermally and electrically compatible with the diamond substrate 4, although it will be appreciated by persons skilled in the art that materials other than diamond can be used to create a depletion effect. Electrons are emitted from the distal ends of the metal protrusions 18, and the enhanced electric field created by the semiconductor layer 14 provides sufficient potential to accelerate electrons through the positively charged semiconductor layer 14 into the diamond substrate 4.

The semiconductor layer can be made of sufficiently small thickness (typically in the region of 20 nm) that the layer 14 does not develop lattice stress, thereby enabling use of elements such as nitrogen and phosphorous as dopants. As shown in FIG. 3, when the electric field is applied to the structure of FIG. 2 in the direction shown, the semiconductor layer 14 loses excess electrons into the bulk diamond substrate 4, and this process is enhanced by the high electric field generated by the elongate structure of the metal protrusions 18. Because the electrons are close to the conduction band of diamond, this process requires lower voltages than would be required to cause an electron to move directly from a metal protrusion 18 into the diamond substrate 4. As a result, the semiconductor layer 14 becomes depleted of electrons and becomes highly positively space charged, which causes the electric field across the semiconductor layer 14 to exceed the approximately $10^7$ Vmm$^{-1}$ field condition necessary to stimulate Fowler-Nordheim tunnelling from the junction of the metal protrusions 18 and the semiconductor layer 14. Under this condition, the metal protrusions 18 are caused to inject electrons to neutralise the positive space charge, but because the semiconductor layer 14 is so thin, electrons pass directly through the semiconductor layer 14 into the diamond substrate 4 without significantly neutralising the space charge. By suitable choice of the thickness of the semiconductor layer 14, it can be ensured that the local electric field is sufficiently concentrated that the $10^7$ Vmm$^{-1}$ criterion for tunnelling emission is met, but that the field also rapidly diminishes so that emitted electrons are not accelerated to the extent that electrons then collide inelastically with carbon atoms in the lattice of the bulk diamond 4, which could cause the atoms to become ionised, which in turn could cause an avalanche process that could destroy the device 2.

Figure 4:
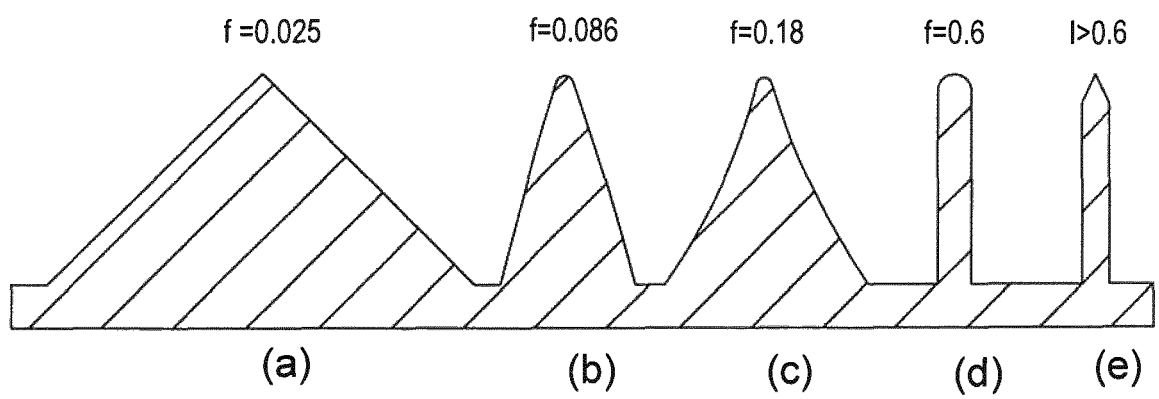
FIG. 4 is an illustration of the effect of shape of electrically conductive portion on electric field enhancement factor.

FIG. 4 shows the effect of the shape of the conductive metal protrusions 18 on electric field enhancement. The level of field intensification relative to an expected uniform field, referred to as the β factor, is related to the ratio of the protrusion height above the plane at its base, and its diameter, although the geometric shape also has an effect. As can be seen in FIG. 4(*e*), the shape of the protrusions 18 shown in FIG. 1 has a significantly enhanced effect on the electric field.

Figure 5:
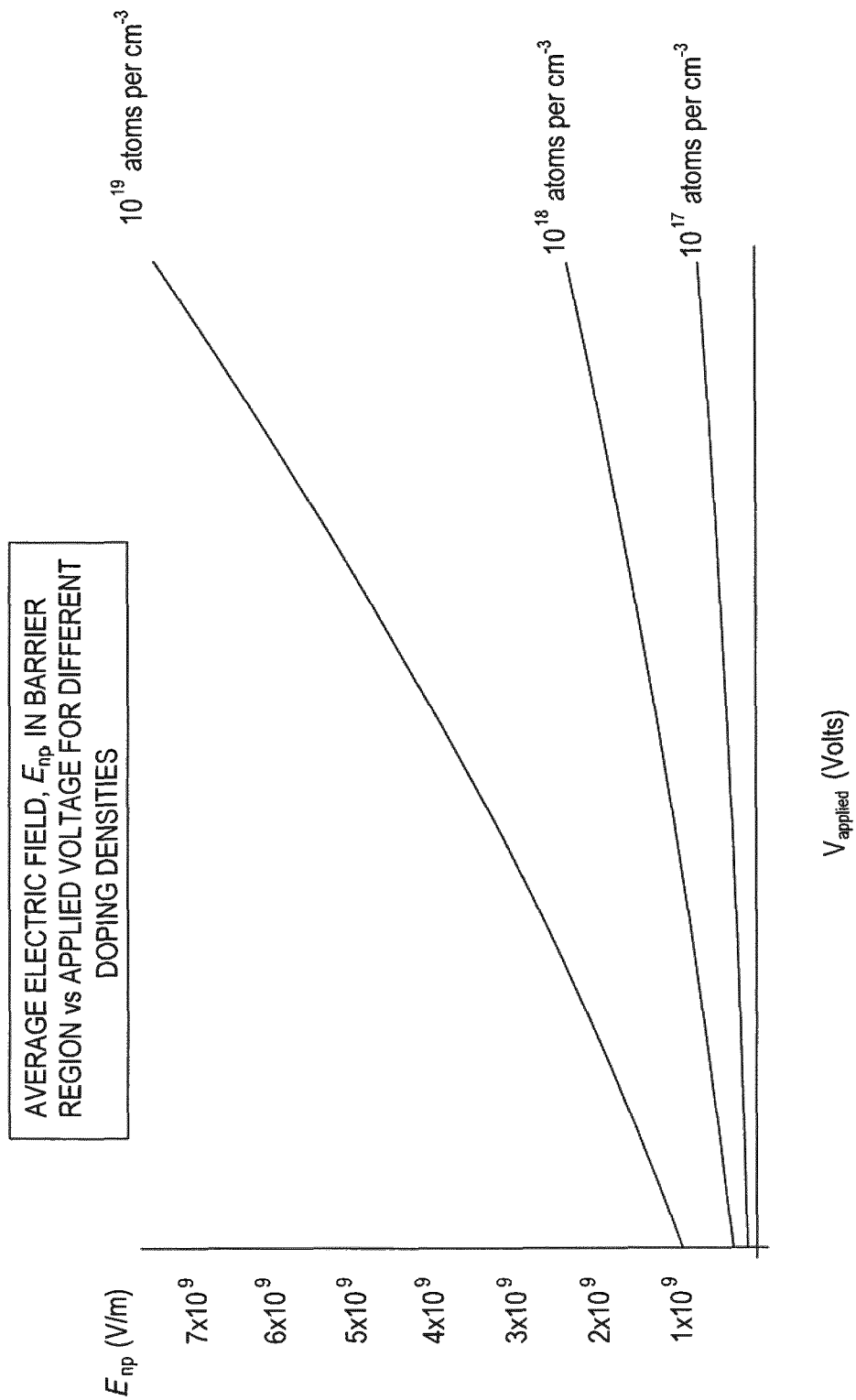
FIG. 5 shows the effect of dopant concentration on average electric field in the semiconductor layer of the device of FIG. 1.
Figure 6:
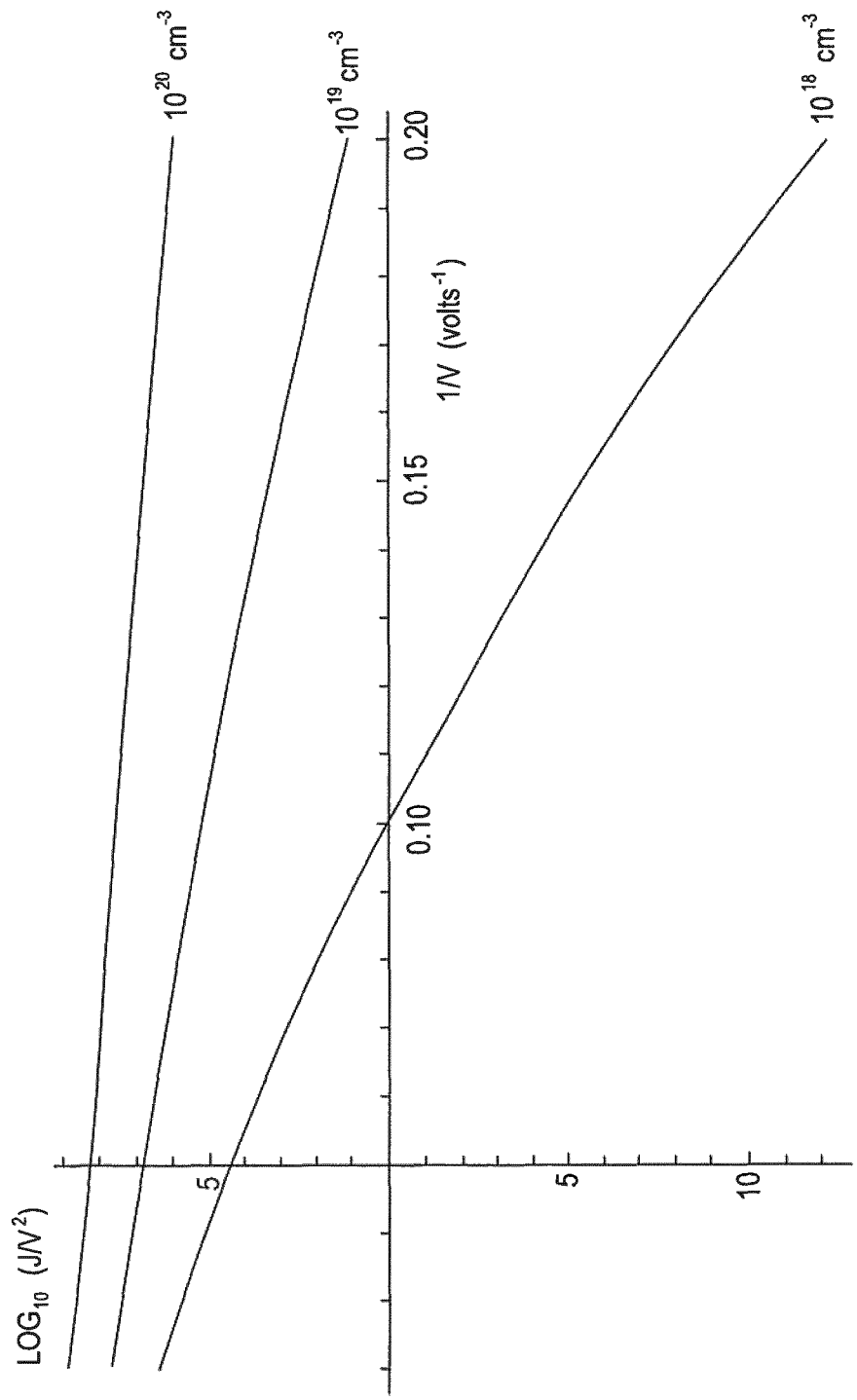
FIG. 6 shows the effect of dopant concentration on tunnelling current density in the layer structure of FIG. 2.
Figure 7:
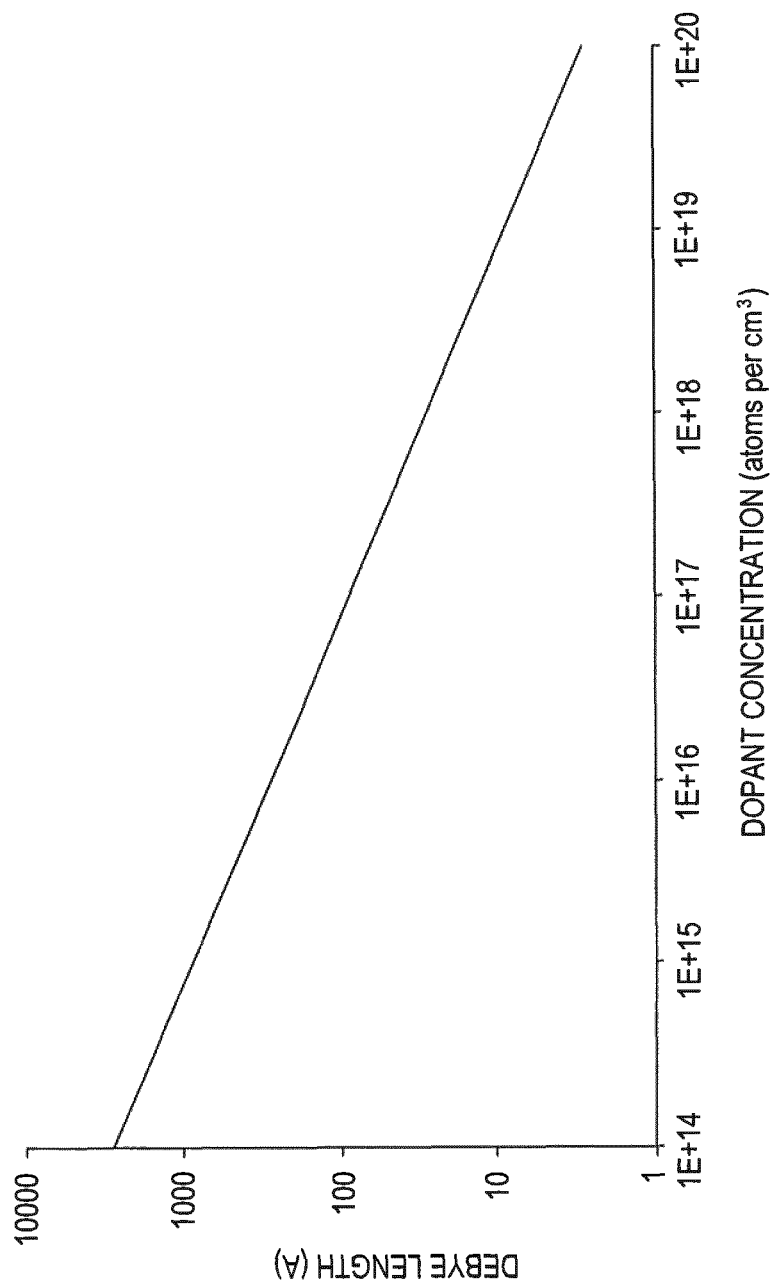
FIG. 7 shows the effect of dopant concentration on Debye length in the diamond substrate of the layer structure of FIG. 2.

FIG. 5 shows the effect of dopant concentration in the semiconductor layer 14 on electric field enhancement. The level of dopant concentration has an effect both on the amplification of the electric field around a metal protrusion 18, and the current emitted from each protrusion 18. The dopant level in the semiconductor layer 14 also has an effect on the current density of electron emission from the tip of each protrusion 18. This is shown in FIG. 6.

The thickness of the semiconductor layer 14 also has an effect on the effectiveness of the device 2. The high electric fields generated within the depletion layer formed at the point of emission at the tips of the protrusions 18 exceeds the insulation strength of the base diamond material. In order to prevent emitted electrons from gaining so much energy that they can trigger an avalanche effect or dielectric failure of the material, the layer thickness needs to be restricted so that the energy imparted to the electrons during transit is insufficient to accelerate them to the velocities which would cause this effect. This is expressed in terms of the Debye length, which is itself determined by the dopant concentration in the semiconductor layer 14, as shown in FIG. 5. In the present case, the dopant concentration level should be in excess of $10^{18}$ atoms per cm$^3$, and preferably in excess of $10^{20}$ atoms per cm$^3$ to maximise field enhancement. This suggests a thickness of the semiconductor layer 14 in the region of 1-10 Debye lengths.

It will be appreciated by persons skilled in the art that the above embodiment has been described by way of example only and not in any limitative sense, and that various alterations and modifications are possible without departure from the scope of the invention as defined by the appended claims. For example, the diamond substrate 4 used in the present invention can be made from single crystal diamond, but the principles of the invention described above could also be applied to nano-crystalline diamond. In the latter case, the shape of the hole is more likely to be an elongate cylinder.

The invention claimed is:

1. An electrical device comprising:
   a substrate of diamond material;
   at least one elongate first electrically conductive portion extending into a respective recess in said substrate, wherein said respective recess extends from a surface of the substrate; and
   at least one doped semiconducting region, arranged between said at least one respective said first electrically conductive portion and said substrate, and adapted to behave as an n type semiconducting material on application of an electric field, between said first electrically conductive portion and said substrate, suitable to cause a region of positive space charge within the said at least one doped semiconducting region, wherein said respective recess further comprises at least one inclined distal surface defining a point at a tip of said respective recess, wherein said at least one doped semiconducting region is arranged on a said at least one respective inclined distal surface.

2. The device of claim 1, wherein said at least one doped semiconducting region includes diamond.

3. The device of claim 1, wherein said at least one doped semiconducting region includes at least one donor dopant to impart an n-type semiconducting characteristic to said region.

4. The device of claim 3, wherein said at least one doped semiconducting region includes a plurality of dopant materials to impart an n-type semiconducting characteristic to said region.

5. The device of claim 3, wherein said at least one donor dopant is a group I element.

6. The device of claim 3, wherein said at least one donor dopant is a group V element.

7. The device of claim 3, wherein said at least one donor dopant is a group VI element.

8. The device of claim 1, wherein said at least one elongate first electrically conductive portion is adapted to locally enhance said electric field.

9. The device of claim 1, wherein said at least one elongate first electrically conductive portion includes at least one metal that forms a Schottky contact with said at least one doped semiconducting region.

10. The device of claim 1, further comprising at least one second electrically conductive portion connected to said at least one elongate first electrically conductive portion.

11. The device of claim 1, further comprising at least one first terminating material terminating at least part of a surface of said at least one doped semiconducting region to impart positive electron affinity thereto.

12. The device of claim 11, wherein said at least one first terminating material comprises oxygen.

13. The device of claim 11, wherein said at least one first terminating material comprises fluorine.

14. A method of forming an electrical device, the method comprising:
forming at least one recess in a substrate of diamond material, wherein said at least one recess extends from a surface of the substrate;
forming at least one doped semiconducting region in said at least one recess; and
forming at least one elongate first electrically conductive portion in said at least one recess, wherein said at least one doped semiconducting region is arranged between said at least one elongate first electrically conductive portion and said substrate and is adapted to behave as an n type semiconducting material on application of an electric field, between said at least one elongate first electrically conductive portion and said substrate, suitable to cause a region of positive space charge within said at least one doped semiconducting region,
wherein forming said at least one recess comprises forming at least one inclined distal surface defining a point at a tip of said at least one recess, wherein said at least one doped semiconducting region is arranged on said at least one inclined distal surface.

15. The method of claim 14, wherein said at least one doped semiconducting region includes diamond.

16. The method of claim 14, wherein said at least one doped semiconducting region includes at least one donor dopant to impart an n-type semiconducting characteristic to said region.

17. The method of claim 16, wherein said at least one doped semiconducting region includes a plurality of dopant materials to impart an n-type semiconducting characteristic to said region.

18. The method of claim 16, wherein said at least one donor dopant is a group I element.

19. The method of claim 16, wherein said at least one donor dopant is a group V element.

20. The method of claim 16, wherein said at least one donor dopant is a group VI element.

21. The method of claim 14, wherein said at least one elongate first electrically conductive portion is adapted to locally enhance said electric field.

22. The method of claim 14, further comprising applying at least one second electrically conductive portion to said at least one elongate first electrically conductive portion.

23. The method of claim 14, further comprising terminating at least part of a surface of said at least one doped semiconducting region to impart positive electron affinity thereto.

24. The method of according to claim 14, wherein the step of forming said at least one recess in said substrate of diamond material comprises arranging at least one catalytic material on a surface of said substrate, causing said catalytic material to convert diamond in contact therewith into non-diamond carbon material, and causing said catalytic material to penetrate said substrate.

* * * * *